United States Patent
Iwai

(10) Patent No.: US 9,801,346 B2
(45) Date of Patent: Oct. 31, 2017

(54) SOIL CULTIVATION SYSTEM EQUIPPED WITH SOLAR PANEL

(71) Applicant: Farm Land Co., Ltd., Maebashi-shi, Gunma (JP)

(72) Inventor: Masayuki Iwai, Maebashi (JP)

(73) Assignee: Farm Land Co., Ltd., Maebashi-shi, Gunma (JP)

(*) Notice: Subject to any disclaimer, the term of this patent is extended or adjusted under 35 U.S.C. 154(b) by 0 days.

(21) Appl. No.: 15/475,130

(22) Filed: Mar. 31, 2017

(65) Prior Publication Data
US 2017/0202155 A1 Jul. 20, 2017

Related U.S. Application Data

(63) Continuation of application No. PCT/JP2016/068497, filed on Jun. 22, 2016.

(30) Foreign Application Priority Data

Aug. 6, 2015 (JP) ................................. 2015-155751

(51) Int. Cl.
*A01G 9/00* (2006.01)
*A01G 7/00* (2006.01)
(Continued)

(52) U.S. Cl.
CPC .............. *A01G 7/00* (2013.01); *A01G 7/045* (2013.01); *E04B 7/02* (2013.01); *E04B 7/16* (2013.01);
(Continued)

(58) Field of Classification Search
CPC .......... A01G 31/02; A01G 7/045; A01G 9/02; A01G 9/243; H02S 20/23
See application file for complete search history.

(56) References Cited

U.S. PATENT DOCUMENTS 7,162,833 B2 * 1/2007 Faris .................. A01G 13/0206
47/58.1 LS
8,186,100 B2 * 5/2012 Chuang ................... A01G 9/243
47/17
(Continued)

FOREIGN PATENT DOCUMENTS

CN 203646192 U 6/2014
JP H04-077756 U 7/1992
(Continued)

OTHER PUBLICATIONS

International Search Report for PCT/JP2016/068497 dated Sep. 13, 2016.
PCT written opinion dated Sep. 13, 2016.

*Primary Examiner* — Kristen C Hayes
(74) *Attorney, Agent, or Firm* — Yokoi & Co., U.S.A.; Toshiyuki Yokoi

(57) ABSTRACT

In the soil cultivation system (80) equipped with a solar panel, a light transmitting region (A) is provided in a solar panel (50), and thus a larger amount of light is captured into a frame unit and can thereby be utilized for the cultivation of agricultural plants (P1, P2). Double-sided light receiving solar cells (52) are adopted in the solar panel (50), and thus light reflected off an agricultural ground surface, the agricultural plants (P1, P2), a sheet-shaped member and the like can be effectively utilized for power generation. In this way, it is possible to compensate for a reduction in the area of the solar cells caused by the formation of the transmitting regions A, and it is possible to obtain a large amount of power generated while acquiring the amount of light on the agricultural plants.

2 Claims, 7 Drawing Sheets

(51) Int. Cl.
  *A01G 7/04*    (2006.01)
  *H02S 30/10*    (2014.01)
  *H02S 40/22*    (2014.01)
  *H02S 20/23*    (2014.01)
  *H02S 99/00*    (2014.01)
  *E04B 7/02*    (2006.01)
  *E04B 7/18*    (2006.01)
  *E04B 7/16*    (2006.01)
  *E04D 13/064*    (2006.01)

(52) U.S. Cl.
  CPC ............... *E04B 7/18* (2013.01); *H02S 20/23* (2014.12); *H02S 30/10* (2014.12); *H02S 40/22* (2014.12); *H02S 99/00* (2013.01); *E04D 13/064* (2013.01)

(56) References Cited

U.S. PATENT DOCUMENTS

| | | | |
|---|---|---|---|
| 2010/0236164 A1* | 9/2010 | Chuang | A01G 9/243 52/173.3 |
| 2011/0005128 A1* | 1/2011 | Chuang | A01G 9/243 47/17 |
| 2016/0081282 A1* | 3/2016 | Salomon | E04B 7/12 136/248 |

FOREIGN PATENT DOCUMENTS

| | | |
|---|---|---|
| JP | H09-172883 A | 7/1997 |
| JP | 2002-026357 A | 1/2002 |
| JP | 2011-109991 A | 6/2011 |
| JP | 2014-018082 A | 2/2014 |
| JP | 2015-113678 A | 6/2015 |
| JP | 2015-139388 A | 8/2015 |

\* cited by examiner

SOIL CULTIVATION SYSTEM EQUIPPED WITH SOLAR PANEL

CROSS-REFERENCES TO RELATED APPLICATIONS

This Application claims the benefit of priority and is a Continuation application of the prior International Patent Application No. PCT/JP2016/068497, with an international filing date of Jun. 22, 2016, which designated the United States, and is related to the Japanese Patent Application No. 2015-155751, filed Aug. 6, 2015, the entire disclosures of all applications are expressly incorporated by reference in their entirety herein.

BACKGROUND OF THE INVENTION

1. Field of the Invention

The present invention relates to a soil cultivation system equipped with a solar panel in which agricultural plants are cultivated under the solar panel.

2. Description of Related Art

In recent years, a growing interest in renewable energy has led to the widespread use of solar panels, which receives sunlight and generates power, to ordinary homes and ordinary businesses. Mega solar power plants wherein solar panels are disposed in a relatively large space are also built in many places. However, when a solar panel is placed on the ground, in many cases, the area under the solar panel is not utilized. Taking such a problem into consideration, an invention described in the following [Patent Literature 1] discloses a technique wherein an agricultural plant is cultivated on the ground under a solar panel.

[Patent Literature 1] Japanese Published Unexamined Patent Application No. 2014-018082

BRIEF SUMMARY OF THE INVENTION

However, there is a problem that in the invention disclosed in [Patent Literature 1], the amount of light on agricultural plants is insufficient, and thus agricultural plants which can be cultivated is limited. In order to cope with this problem, it can be considered that a light transmitting region is provided between solar panels so as to increase the amount of light on agricultural plants. However, when the light transmitting region is provided in the solar panels, a power generation region is reduced, with the result that the amount of power generated is disadvantageously reduced.

The present invention has been made in view of such a situation, and an object thereof is to provide a soil cultivation system equipped with a solar panel which has a large amount of power generated while securing the amount of light on agricultural plants.

(1) The present invention solves the above problems by providing a soil cultivation system 80 equipped with a solar panel including: a solar panel 50 which receives light to generate power; and a frame unit which is provided to stand on an agricultural ground where an agricultural plant P1, P2 is cultivated and which holds the solar panel 50 at a predetermined angle, wherein the solar panel 50 includes: a panel board portion 54 which has light transmissivity; a plurality of double-sided light receiving solar cells 52 which are arranged with a predetermined gap provided therebetween in the panel board portion 54 and which have power generation regions on both surfaces; and a light transmitting region A which is formed by the gaps of the double-sided light receiving solar cells 52, the frame unit is long in a horizontal direction, and a plurality of frame units are aligned in a vertical direction, in a space between ridges of the frame units, a transmissive roof member 40 is provided, a cover unit 24 which has light transmissivity and which is freely opened and closed and which is provided to integrally cover the plurality of the frame units and sides of the space between the ridges and a reflection sheet 44 which has light reflectivity is further installed over a substantially entire surface below the roof member 40 provided in the space between the ridges such that the agricultural plant P1, P2 is cultivated even in the agricultural ground in the space between the ridges, the roof member 40 is a light diffusion plate or a light diffusion film, and the reflection sheet 44 reflects part of light and transmits part of light and can be opened and closed and fitted and removed, the power generation region on a back surface side of the double-sided light receiving solar cell 52 receives light reflected off an agricultural multi-sheet 56a covering an agricultural ground surface or an agricultural tunnel sheet 56b covering the agricultural plant P1, P2 to generate power and the soil cultivation system 80 equipped with a solar panel further includes a cultivation box 30 with an upper surface opened which is placed on the agricultural ground and a water spray pipe 12 which supplies a cultivation nutrient solution into the cultivation box 30 such that the agricultural plant is cultivated within the cultivation box 30.

(2) The present invention solves the above problems by providing the soil cultivation system 80 equipped with a solar panel according to the above (1), wherein the height H1 of the lowest point within the frame unit is set to 200 cm to 300 cm from the agricultural ground surface, the depth W of the frame unit is set to 200 cm to 300 cm and a reinforcement frame 20c in a forward and backward direction of the frame unit is provided at a position 150 cm or more higher than the agricultural ground surface.

In the soil cultivation system equipped with a solar panel according to the present invention, a light transmitting region is provided in a solar panel, and thus a larger amount of light is captured into a frame unit and can thereby be utilized for the cultivation of agricultural plants. In addition, double-sided light receiving solar cells are adopted in the solar panel, and thus light reflected off an agricultural ground surface and the like can be effectively utilized for power generation. In this way, it is possible to obtain a large amount of power generated while securing the amount of light on the agricultural plants.

DETAILED DESCRIPTION OF THE INVENTION

Figure 1:
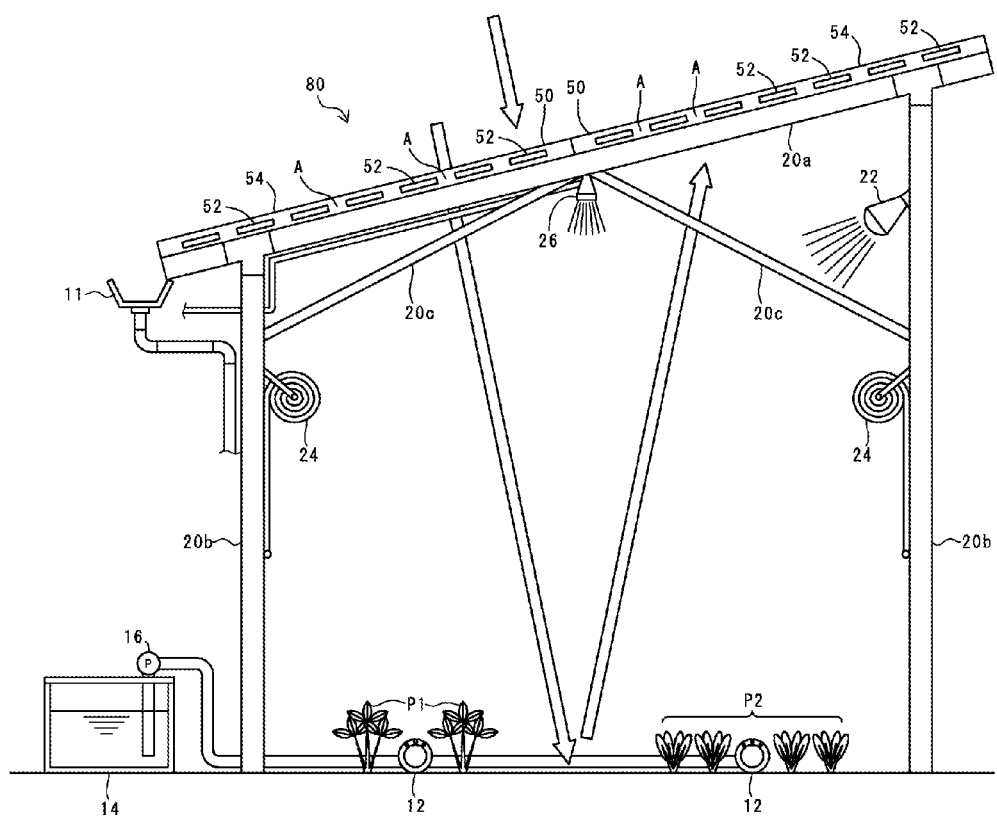
FIG. 1 is a view for illustrating a soil cultivation system equipped with a solar panel according to the present invention.

An embodiment of a soil cultivation system 80 equipped with a solar panel according to the present invention will be described with reference to drawings. The soil cultivation system 80 equipped with a solar panel according to the present invention shown in FIG. 1 includes: solar panels 50 which receive light to generate power; and frame units 20 which have a transverse frame 20a and a vertical frame 20b, which is provided to stand on an agricultural ground where agricultural plants P1 and P2 are cultivated to hold the solar panels 50 at a specific angle.

Figure 2:
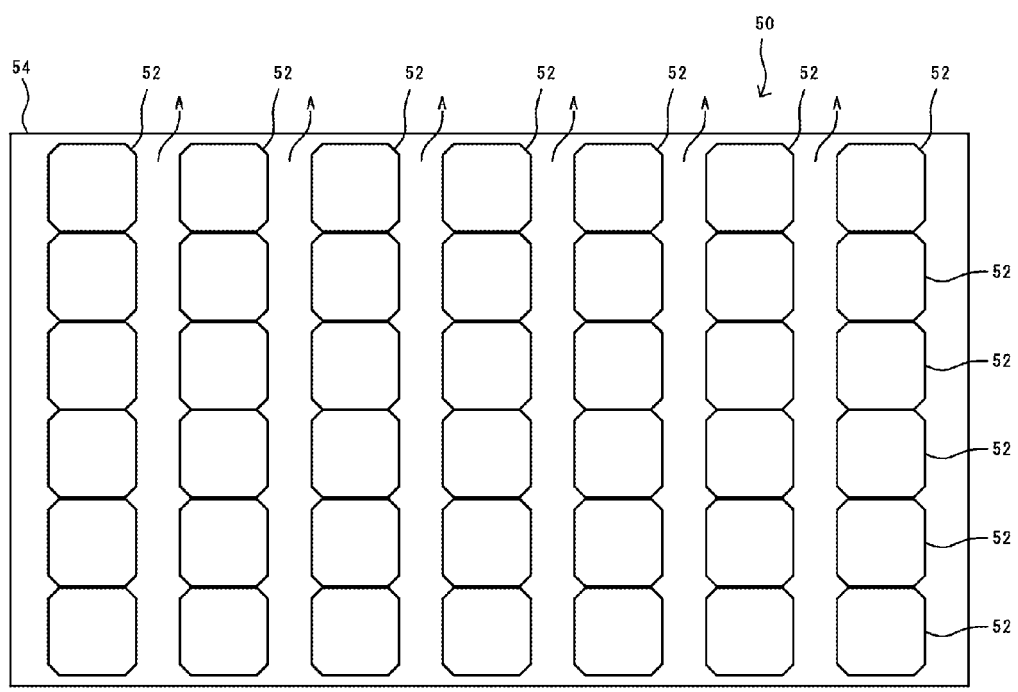
FIG. 2 is a view for illustrating the solar panels of the soil cultivation system equipped with a solar panel according to the present invention.

As shown in FIG. 2, the solar panel 50 includes a panel board portion 54 such as glass which has light transmissivity and known double-sided light receiving solar cells 52 which are provided in the panel board portion 54 and in which a power generation region is provided on both surfaces. A plurality of the double-sided light receiving solar cells 52 are arranged with a specific gap in the panel board portion 54, and the gap between the double-sided light receiving solar cells 52 is a light transmitting region A in the solar panel 50. A space between the solar panels 50 is blocked, and thus the infiltration of rainwater and the like into the frame unit through the gap in the solar panels 50 is prevented. It is to be noted that although FIG. 2 illustrates an example where 6 double-sided light receiving solar cells 52 are disposed adjacent to each other in the vertical direction of the figure, and 7 rows are arranged with a gap in the horizontal direction of the figure, it is to be noted that the arrangement of the double-sided light receiving solar cells 52 is not particularly limited to such an example and may be any other arrangement. However, the area of the light transmitting region A is preferably set to approximately 20 to 30% of the solar panel 50 from a balance between the amount of light acquired and the amount of power generated, and for example, in a solar panel 50 having dimensions capable of an arrangement of 6×10 rows in the entire surface, as shown in FIG. 2, an arrangement of 6×7 rows or 6×8 rows is preferably adopted. The light transmitting regions A of the double-sided light receiving solar cells 52 may be provided in the horizontal direction or may be provided both in the vertical and horizontal directions. However, preferably, in terms of wiring of the solar panels 50, as shown in FIG. 2, the double-sided light receiving solar cells 52 are disposed adjacent to each other in the vertical direction, and are arranged with a gap in the horizontal direction.

Figure 3:
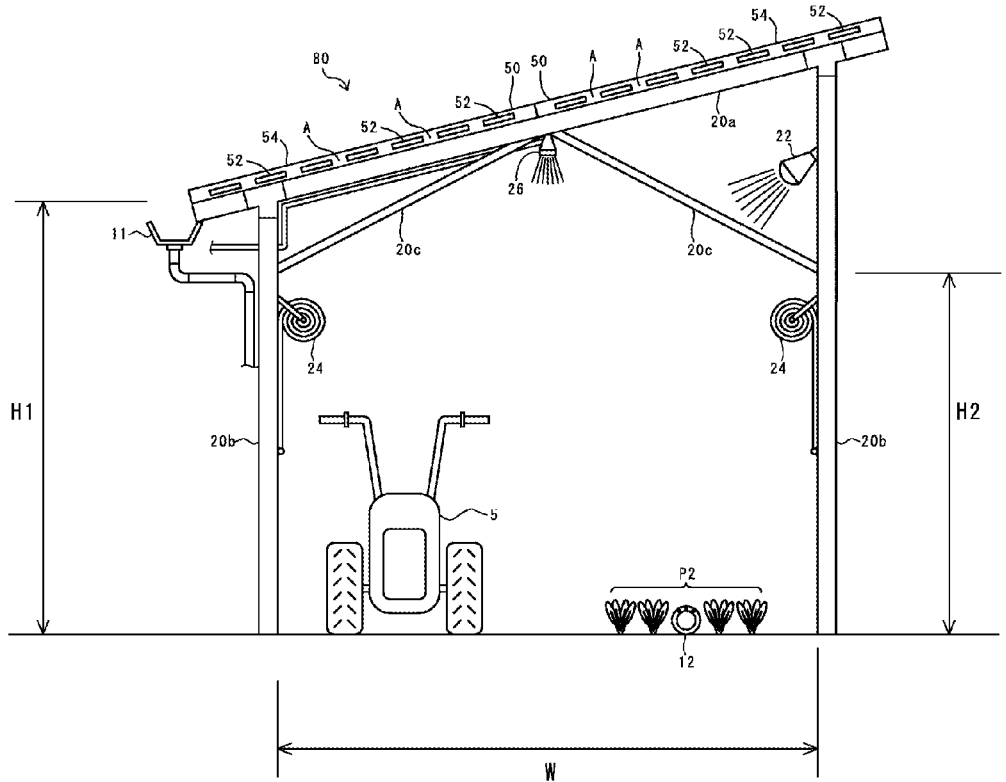
FIG. 3 is a view for illustrating the dimensions of the soil cultivation system equipped with a solar panel according to the present invention.

The transverse frame 20a configured to hold the solar panel 50 is generally faced south and is fixed at an angle whereby the solar panel 50 is irradiated most efficiently with sunlight. Preferably, as shown in FIG. 3, the length of the vertical frame 20b is set such that the height H1 of the lowest point of the interior of the frame unit is placed at a relatively high position of approximately 200 cm to 300 cm (preferably, approximately 250 cm) from the agricultural ground surface. An interval between the front and back vertical frames 20b, that is, the depth W of the frame unit is preferably set to approximately 200 cm to 300 cm. Both in the horizontal direction (the longitudinal direction) and in the forward and backward direction (the depth direction) of the frame unit, reinforcement frames 20c which obliquely connect the vertical frame 20b and the transverse frame 20a and which function as a bracing are preferably provided. In particular, in the reinforcement frame in the forward and backward direction, the height H2 of the lowest point thereof is preferably placed at a position 150 cm higher than the ground surface. With such a structure, an agricultural machine 5 such as a tractor can be used within the frame unit, and thus it is possible to reduce a burden of agricultural work.

It is to be noted that the height H1 from the agricultural ground surface is provided so as to be large, and thus sunlight passing through the light transmitting regions A spreads such as by diffraction, with the result that the sunlight can be irradiated to agricultural plants P1 and P2 in a wider range. It is to be noted that the surfaces of the transverse frame 20a, the vertical frame 20b and the reinforcement frame 20c are preferably coated with white paint or the like having light reflectivity, or the surfaces of the transverse frame 20a, the vertical frame 20b and the reinforcement frame 20c to be used preferably have metallic luster. Furthermore, a rain gutter 11 is preferably placed at the transverse frame 20a, so as to guide rainwater or the like flowing on the solar panel 50 toward a specific catch drain or the like. With such a structure, rainwater flowing on the solar panel 50 does not drip onto the ground surface, and therefore mud splattering or the like caused by such dripping can be prevented.

On a side surface of the frame unit, a cover unit 24 which has light transmissivity and which is freely opened and closed is provided. A windable and transparent sheet made of synthetic resin is particularly preferably as this cover unit 24. However, the cover unit 24 is not limited to such a sheet, and a glass plate, a door or the like which can be opened and closed may be used. By suitably opening or closing the cover unit 24 depending on the weather, the temperature or the like, a side face of the frame unit is put into an opened state, a closed state or a half-opened state. Thus, infiltration of rainwater into the frame unit can be prevented by closing the cover unit 24 in rainy weather, for example. Moreover, damage by strong winds can be prevented. Moreover, the temperature in the frame unit can be adjusted by putting the cover unit 24 into an opened state, a closed state or a half-opened state depending on the outdoor temperature. Thus, the growth environment of the agricultural plants P1 and P2 in the frame unit can be managed to a certain extent. Moreover, the working environment of the operator can be improved. In particular, preferably, the opened state of the cover unit 24 provided between the vertical frames 20b in the forward and backward direction is relatively enlarged, and thus the agricultural machine 5 can enter the interior of the frame unit in this direction.

As shown in FIG. 1, in the soil cultivation system 80 equipped with a solar panel according to the present invention, a water spray pipe 12 is arranged along the ridges of the agricultural plants P1 and P2, and the soil cultivation system 80 equipped with a solar panel includes: a nutrient solution tank 14 in which a cultivation nutrient solution containing fertilizer components of an appropriate concentration is stored; and a solution feed pump 16 which feeds the cultivation nutrient solution to the water spray pipe 12. With such a structure, it is possible to manually or automatically supply the cultivation nutrient solution suitable for the cultivation of the agricultural plants P1 and P2 to the agricultural ground. In this way, it is possible to efficiently cultivate the agricultural plants P1 and P2 and to reduce a burden of agricultural work. The structure can be applied to the structures of FIGS. 4 to 6 which will be described later.

Furthermore, a sprinkling device 26 such as a sprinkler or a mist device configured to spray water on the agricultural plants P1 and P2 may be provided at the transverse frame 20a. In particular, when the mist device is provided, since it is possible to lower the temperature of the interior of the frame unit 20 by vaporization heat, it is also possible to simultaneously improve the working environment. It is to be noted that a water supply pipe to the sprinkling device 26 may be placed along the transverse frame 20a, or may be placed through the transverse frame 20a.

In a section of the frame unit inevitably having an insufficient received light quantity, it is to be noted that an auxiliary lamp 22 may be placed over the section as needed, so that the auxiliary lamp 22 compensates for shortage of light quantity. It is to be noted that a well-known lighting lamp such as an LED lamp or a fluorescent lamp can be used as the auxiliary lamp 22. Moreover, the agricultural ground may be divided into a plurality of sections depending on the amount of light received within the frame unit such that the agricultural plants P1 and P2 to be cultivated are varied depending on the amount of light received within the section. With such a structure, an appropriate agricultural plant P1 or P2 can be selected and cultivated depending on the received light quantity of the section, and therefore efficient cultivation of the agricultural plants P1 and P2 can be achieved.

Figure 4:
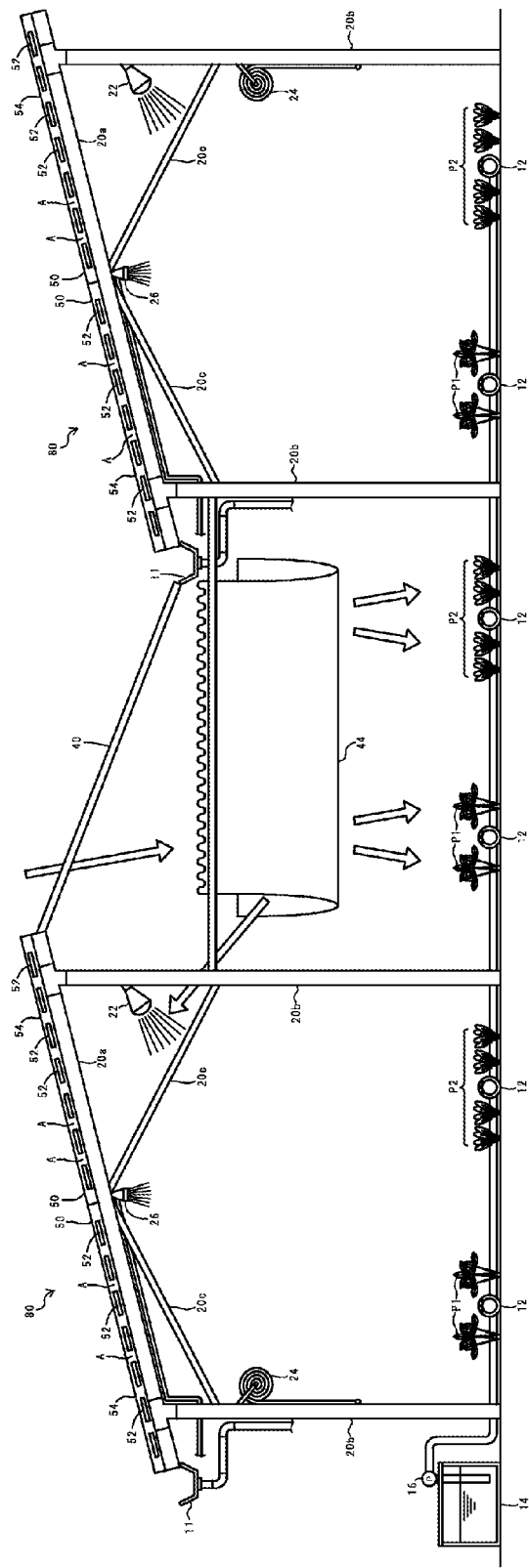
FIG. 4 is a view for illustrating the soil cultivation system equipped with a solar panel according to the present invention in which spaces between ridges are coupled.
Figure 5:
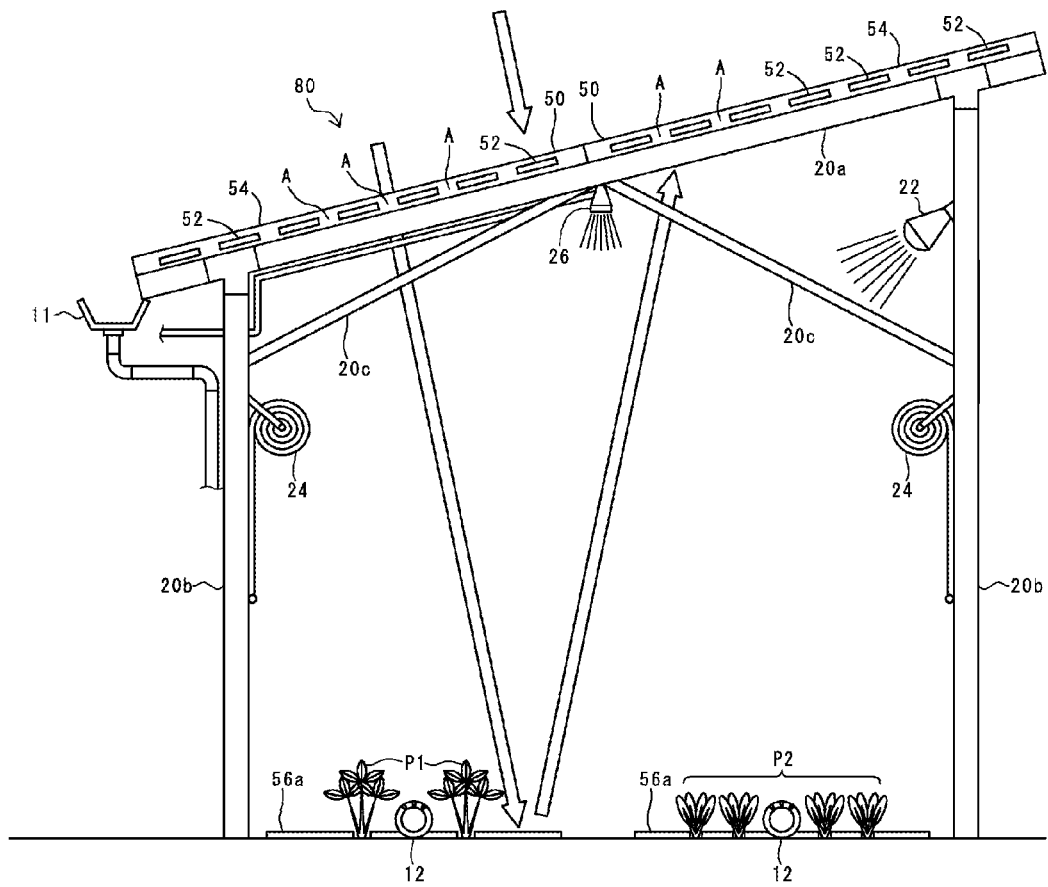
FIG. 5 is a view for illustrating an example of the soil cultivation system equipped with a solar panel according to the present invention in which a sheet-shaped member is provided.

When the soil cultivation system 80 equipped with a solar panel is provided, the frame unit on which the solar panels 50 are installed is long in the horizontal direction, and furthermore, a plurality of frame units are installed so as to be aligned in the vertical direction. As shown in FIG. 4, a light transmissive roof member 40 is provided between a space between the ridges of the plurality of the frame units, and the frame units are coupled with the roof member 40, with the result that it is possible to cultivate the agricultural plants P1 and P2 even in the space between the ridges. Furthermore, below the roof member 40 in the space between the ridges, a reflection sheet 44 having light reflectivity is installed, and as indicated by white-solid arrows in FIG. 4, light which enters the space between the ridges is reflected toward the power generation regions on the back surface side of the double-sided light receiving solar cells 52. With such a structure, the light which enters the space between the ridges can also be effectively utilized for power generation, and thus it is possible to obtain a larger amount of power generated. As the roof member 40, a light diffusion plate or a light diffusion film is used such that light entering the roof member 40 is transmitted while being diffused to some extent. As the light diffusion plate or the light diffusion film used here, a matte light diffusion plate or a matte light diffusion film in which fine projections and recesses are formed in the surface is particularly preferably used. With such a structure, it is possible to reduce variations in the intensity of light within the soil cultivation system 80 equipped with a solar panel to some degree.

As the reflection sheet 44, a white-based mesh sheet is particularly preferably used which reflects part of light and which transmits part of light to the side of the agricultural ground. With such a structure, sunlight is appropriately irradiated even to the agricultural plants P1 and P2 under the reflection sheet 44, and moreover, variations in the intensity of light within the soil cultivation system 80 equipped with a solar panel can be averaged by a light diffusion effect with the reflection sheet 44. It is to be noted that the roof member 40 and the reflection sheet 44 also have the effect of reducing the intense sunshine of summer.

Here, when the reflection sheet 44 is assumed to be a reflection plate, although any fixing member such as a holding leg or a frame is needed, the reflection sheet 44 which is lightweight and flexible is hung with a hook or the like so that it can be easily installed in the soil cultivation system 80 equipped with a solar panel. When a reflective plate is used, it needs to be installed at a high place to some degree so as not to interfere with agricultural work, and the vertical frame 20b is increased in height. In particular, when the agricultural machine 5 is used, the reflection plate needs to be removed each time or needs to be installed at an extremely high place. However, a flexible reflection sheet 44 is used, and thus even when the light reflection 44 is installed at a low place, the operator can perform agricultural work without hitting their head with the reflection sheet 44. The light diffusion plate cannot be easily fitted and removed, on the other hand, the reflection sheet 44 can be easily opened and closed such as by being bundled, and it is possible to easily adjust the area and angle thereof according to the work, the amount of sunshine or the like.

In the soil cultivation system 80 equipped with a solar panel according to the present invention, the sides of the space between the ridges are also covered with a cover unit 24. With such a structure, a plurality of frame units and spaces between ridges are integrally covered, and thus the soil cultivation system 80 equipped with a solar panel functions as if it were one cultivation house. Preferably, the opened state of the cover unit 24 in the space between the ridges is also relatively enlarged, and thus the agricultural machine 5 can enter the interior of the frame unit in this direction.

An operation of the soil cultivation system 80 equipped with a solar panel according to the present invention will next be described. In FIGS. 1, 5, 6 and 7, white-solid arrows indicate the direction of the travel of light. Although here, an example of the direction of the travel of light in one frame unit will be described, the following description is the same as in the structure of FIG. 4 in which spaces between ridges are coupled.

First, when sunlight is irradiated to the solar panels 50, the power generation regions on the front surface side of the double-sided light receiving solar cells 52 generate and output power. The power output is fed through a power feed system (not shown) to a power selling unit, a storage battery, power demand or the like. Sunlight irradiated to the light transmitting regions A in the solar panels 50 is transmitted through the light transmitting regions A and is captured into the frame unit. The sunlight captured into the frame unit is irradiated to the agricultural plants P1 and P2 and is used for the cultivation of the agricultural plants P1 and P2. The light of the sunlight which is captured into the frame unit and which is not irradiated to the agricultural plants P1 and P2 is, as shown in FIG. 1, reflected off the agricultural ground surface toward the back surface side of the double-sided light receiving solar cells 52. About 15% of the sunlight is reflected off the agricultural ground surface, and even with this reflected light, it is possible to sufficiently generate power. In particular, the light of a green wavelength of the sunlight is also reflected off the leaves of the agricultural plants P1 and P2 toward the back surface side of the double-sided light receiving solar cells 52. The light is irradiated, thus the power generation regions on the back surface side generate power and the power generated is fed together with power generated on the front side through the power feed system to a power selling unit, a storage battery, power demand or the like.

Figure 6:
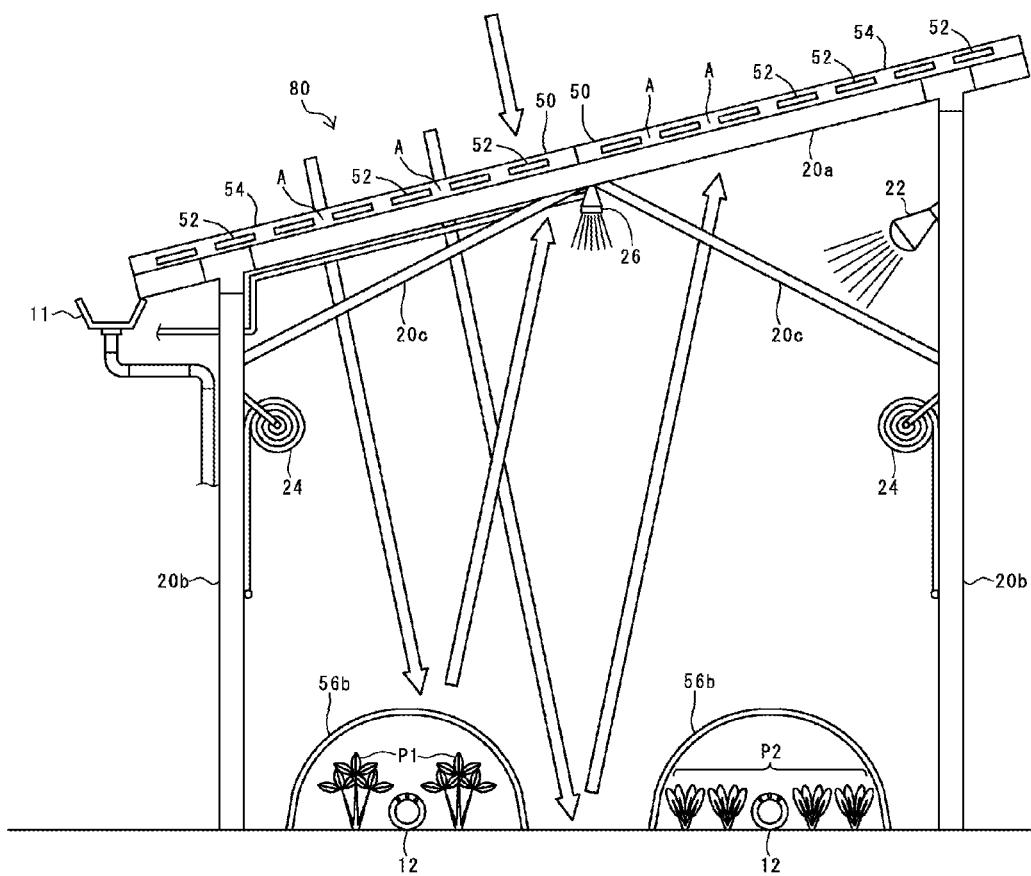
FIG. 6 is a view for illustrating another example of the soil cultivation system equipped with a solar panel according to the present invention in which the sheet-shaped member is provided.

In the soil cultivation system 80 equipped with a solar panel according to the present invention, a sheet-shaped member which has light reflectivity is installed on the agricultural ground surface. As the sheet-shaped member, there is a so-called agricultural multi-sheet 56a which covers the agricultural ground surface shown in FIG. 5 so as to achieve the functions of weed-proofing, moisture retention, heat retention and the like. There is no particular limitation on the agricultural multi-sheet 56a which is used as the sheet-shaped member, and for example, a known agricultural multi-sheet such as a gloss black vinyl sheet, a gray sheet or the like and a sheet which is coated with a metallic thin film such as aluminum or the like. As another example of the sheet-shaped member, there is an agricultural tunnel sheet 56b which is supported with an agricultural tunnel column so as to cover the agricultural plants P1 and P2 in the shape of an arc and which is shown in FIG. 6. There is no particular limitation on the agricultural tunnel sheet 56b which is used as the sheet-shaped member, and a known transparent or translucent agricultural tunnel sheet, an insect deterrent white mesh sheet and the like can be used. When these sheet-shaped members are provided, it is possible to reflect about 30% of sunlight although depending on the material and color thereof. The reflected light is also used for generating power on the back surface side of the double-sided light receiving solar cells 52.

The agricultural ground surface, the agricultural plants P1 and P2, the sheet-shaped member and the like also reflect, for example, light which enters through the side surfaces of the frame unit, the roof member 40 and the like, light of the auxiliary lamp 22 and light reflected off the vertical frames 20b and the like toward the back surface side of the double-sided light receiving solar cells 52. Then, the light described above is also used for generating power on the back surface side of the double-sided light receiving solar cells 52.

Figure 7:
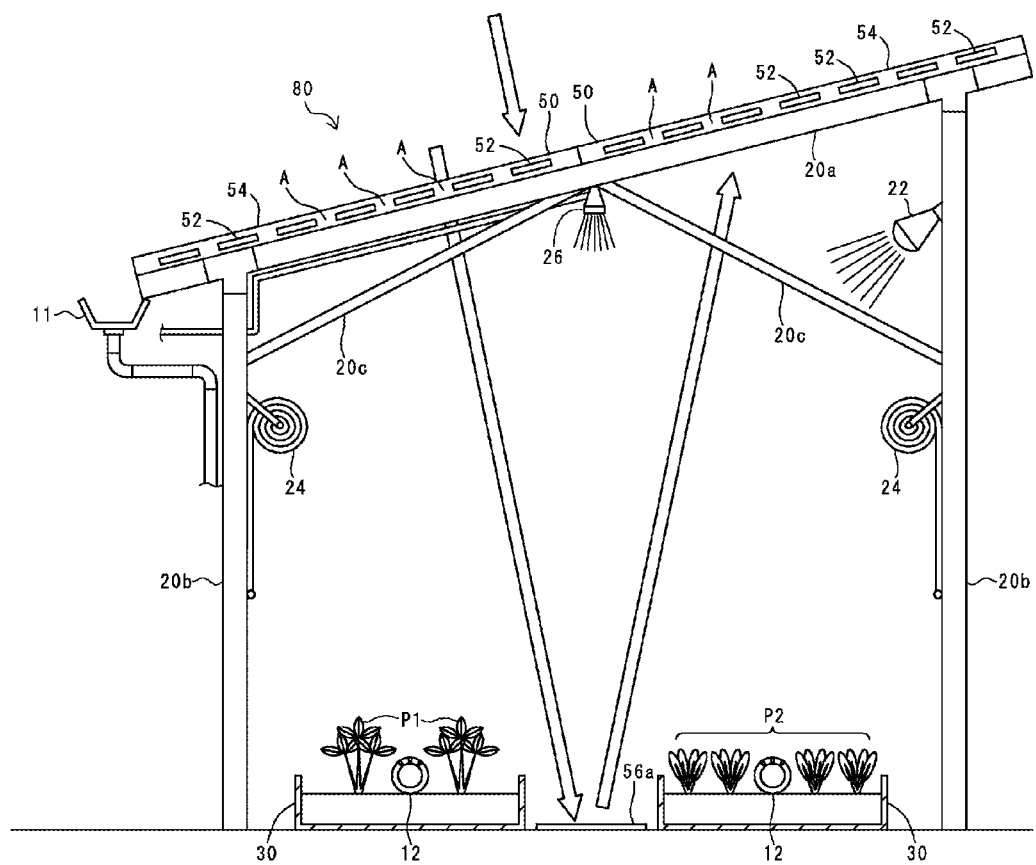
FIG. 7 is a view for illustrating an example of the soil cultivation system equipped with a solar panel according to the present invention in which a cultivation box is provided.

Furthermore, as shown in FIG. 7, the soil cultivation system 80 equipped with a solar panel according to the present invention further includes a cultivation box 30 with its upper surface opened which is placed on the agricultural ground and the water spray pipe 12 which supplies the cultivation nutrient solution into the cultivation box 30, and the agricultural plants P1 and P2 are cultivated in a soil within the cultivation box 30. With such a structure, it is possible to use a soil suitable for the agricultural plants P1 and P2, and it is also possible to more accurately control the cultivation nutrient solution put into the soil. In this way, it is possible to further increase the amount of agricultural plants P1 and P2 harvested.

As described above, in the soil cultivation system 80 equipped with a solar panel according to the present invention, the transmitting regions A are provided in the solar panel 50, and thus a larger amount of light is captured into the frame units and can be utilized for cultivating the agricultural plants P1 and P2. In addition, the double-sided light receiving solar cells 52 are adopted in the solar panel 50, and thus it is possible to effectively utilize light reflected off the agricultural ground surface, the agricultural plants P1 and P2, the sheet-shaped members and the like for power generation. In this way, it is possible to compensate for a reduction in the area of the solar cells caused by the formation of the transmitting regions A, and it is possible to obtain a large amount of power generated while acquiring the amount of light on the agricultural plants.

In addition, the farmer can obtain income from sales of electric power generated by the solar panel 50 or the like in addition to income from sales of the agricultural plants P1 and P2 cultivated on the agricultural ground. Thus, the income of the farmer can be increased.

The shapes, the configurations, the dimensions and the like of the soil cultivation system 80 equipped with a solar panel described in the present embodiment are examples, and the present invention can be varied without departing from the spirit of the present invention and can be practiced.

Note that, this invention is not limited to the above-mentioned embodiments. Although it is to those skilled in the art, the following are disclosed as the one embodiment of this invention.

Mutually substitutable members, configurations, etc. disclosed in the embodiment can be used with their combination altered appropriately.

Although not disclosed in the embodiment, members, configurations, etc. that belong to the known technology and can be substituted with the members, the configurations, etc. disclosed in the embodiment can be appropriately substituted or are used by altering their combination.

Although not disclosed in the embodiment, members, configurations, etc. that those skilled in the art can consider as substitutions of the members, the configurations, etc. disclosed in the embodiment are substituted with the above mentioned appropriately or are used by altering its combination.

While the invention has been particularly shown and described with respect to preferred embodiments thereof, it should be understood by those skilled in the art that the foregoing and other changes in form and detail may be made therein without departing from the sprit and scope of the invention as defined in the appended claims.

EXPLANATION OF THE REFERENCES 12 water spray pipe
20a transverse frame (frame unit)
20b vertical frame (frame unit)
20c reinforcement frame
30 cultivation box
40 roof member
44 reflection sheet
50 solar panel
52 double-sided light receiving solar cell
54 panel board portion
56a agricultural multi-sheet (sheet-shaped member)
56b agricultural tunnel sheet (sheet-shaped member)
80 soil cultivation system equipped with a solar panel
A light transmitting region
P1, P2 agricultural plant

What is claimed is:
1. A soil cultivation system equipped with a solar panel comprising:
   a solar panel which receives light to generate power; and
   a frame unit which is provided to stand on an agricultural ground where an agricultural plant is cultivated and which holds the solar panel at a predetermined angle,
   wherein the solar panel includes: a panel board portion which has light transmissivity; a plurality of double-sided light receiving solar cells which are arranged with a predetermined gap provided therebetween in the panel board portion and which have power generation regions on both surfaces; and a light transmitting region which is formed by the gaps of the double-sided light receiving solar cells, the frame unit is long in a horizontal direction, and a plurality of frame units are aligned in a vertical direction, in a space between ridges of the frame units, a transmissive roof member is provided, a cover unit which has light transmissivity and which is freely opened and closed and which is provided to integrally cover the plurality of the frame units and sides of the space between the ridges and a reflection sheet which has light reflectivity is further installed over a substantially entire surface below the roof member provided in the space between the ridges such that the agricultural plant is cultivated even in the agricultural ground in the space between the ridges, the roof member is a light diffusion plate or a light diffusion film, and the reflection sheet reflects part of light and transmits part of light and can be opened and closed and fitted and removed, the power generation region on a back surface side of the double-sided light receiving solar cell receives light reflected off an agricultural multi-sheet covering an agricultural ground surface or an agricultural tunnel sheet covering the agricultural plant to generate power and the soil cultivation system equipped with a solar panel further includes a cultivation box with an upper surface opened which is placed on the agricultural ground and a water spray pipe which supplies a cultivation nutrient solution into the cultivation box such that the agricultural plant is cultivated within the cultivation box.

2. The soil cultivation system equipped with a solar panel according to claim 1, wherein a height of a lowest point within the frame unit is set to 200 cm to 300 cm from the agricultural ground surface, a depth of the frame unit is set to 200 cm to 300 cm and a reinforcement frame in a forward and backward direction of the frame unit is provided at a position 150 cm or more higher than the agricultural ground surface.

* * * * *